(12) United States Patent
Jin

(10) Patent No.: US 7,959,830 B2
(45) Date of Patent: Jun. 14, 2011

(54) ARTICLES COMPRISING HIGH-ELECTRICAL-CONDUCTIVITY NANOCOMPOSITE MATERIAL AND METHOD FOR FABRICATING SAME

(75) Inventor: Sungho Jin, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 1078 days.

(21) Appl. No.: 10/584,680

(22) PCT Filed: Dec. 23, 2004

(86) PCT No.: PCT/US2004/043458
§ 371 (c)(1),
(2), (4) Date: May 1, 2007

(87) PCT Pub. No.: WO2005/065281
PCT Pub. Date: Jul. 21, 2005

(65) Prior Publication Data
US 2008/0044685 A1   Feb. 21, 2008

Related U.S. Application Data

(60) Provisional application No. 60/533,618, filed on Dec. 31, 2003.

(51) Int. Cl.
*H01B 1/02* (2006.01)
*B32B 3/02* (2006.01)
*B22F 3/00* (2006.01)
*H01L 21/763* (2006.01)

(52) U.S. Cl. ........ 252/500; 428/323; 428/332; 428/403; 428/551; 428/655; 148/405; 148/411; 148/432; 148/668; 148/679; 419/61; 419/64; 205/96; 205/109; 205/169; 438/478

(58) Field of Classification Search .................. 252/500, 252/62.2, 182.1; 428/615, 627, 655, 323, 428/357, 547; 427/212, 217; 75/245–247, 75/343–374; 205/74, 76
See application file for complete search history.

(56) References Cited

U.S. PATENT DOCUMENTS 4,540,546 A * 9/1985 Giessen .................. 420/590
(Continued)

OTHER PUBLICATIONS

Koch, C.C., "Nanostructured Materials—Processing, Properties and Potential Applications," William Andrew Publishing/Noyes, 2001, pp. 439-446.

*Primary Examiner* — Stanley Silverman
*Assistant Examiner* — Kallambella Vijayakumar
(74) *Attorney, Agent, or Firm* — Lowenstein Sandler PC

(57) ABSTRACT

This invention discloses novel nanocomposite material structures which are strong, highly conductive, and fatigue-resistant. It also discloses novel fabrication techniques to obtain such structures. The new nanocomposite materials comprise a high-conductivity base metal, such as copper, incorporating high-conductivity dispersoid particles that simultaneously minimize field enhancements, maintain good thermal conductivity, and enhance mechanical strength. The use of metal nanoparticles with electrical conductivity comparable to that of the base automatically removes the regions of higher RF field and enhanced current density. Additionally, conductive nanoparticles will reduce the surface's sensitivity to arc or sputtering damage. If the surface is sputtered away to uncover the nanoparticles, their properties will not be dramatically different from the base surface. Most importantly, the secondary electron emission coefficients of all materials in the nanocomposite are small and close to unity, whereas the previously used insulating particles can produce significant and undesirable electron multiplication.

26 Claims, 3 Drawing Sheets

U.S. PATENT DOCUMENTS

| | | | |
|---|---|---|---|
| 5,573,608 A * | 11/1996 | Miyake et al. | 148/552 |
| 5,728,195 A * | 3/1998 | Eastman et al. | 75/351 |
| 5,759,230 A * | 6/1998 | Chow et al. | 75/362 |
| 5,925,198 A * | 7/1999 | Das | 148/410 |
| 5,958,575 A | 9/1999 | Fijimoto et al. | |
| 6,858,521 B2 | 2/2005 | Jin | |
| 2001/0008157 A1 * | 7/2001 | Bishop et al. | 148/678 |
| 2004/0071951 A1 | 4/2004 | Jin | |
| 2004/0146734 A1 | 7/2004 | Miller et al. | |

* cited by examiner

ARTICLES COMPRISING HIGH-ELECTRICAL-CONDUCTIVITY NANOCOMPOSITE MATERIAL AND METHOD FOR FABRICATING SAME

CROSS REFERENCE TO RELATED APPLICATIONS

This application is a U.S. National Stage Application of PCT Application No. PCT/US2004/043458, filed on Dec. 23, 2004, which in turn claims the benefit of U.S. Provisional Application Ser. No. 60/533,618 entitled "Articles Comprising High-Electrical Conductivity Nanocomposite Material and Method for Fabricating Same", filed by Sungho Jin on Dec. 31, 2003. The entire disclosures of PCT Application No. PCT/US2004/043458 and U.S. Provisional Application No. 60/533,618 are hereby incorporated herein by reference.

FIELD OF INVENTION

The present invention relates to articles comprising composite materials. In particular, it provides articles comprising bodies of strong, highly conductive nanocomposite materials useful for conducting electrical current at high power levels. Such articles are particularly useful for enhancing the performance of devices such as high power microwave devices, electrical connectors and electrical contacts.

BACKGROUND OF THE INVENTION

High conductivity materials are key components in a variety of important systems such as high power microwave systems (HPM systems) used for communications and radar. HPM systems can enable efficient and powerful microwave telecommunications or they can rapidly disrupt or damage enemy surveillance and communications hardware at significant standoff distances.

Practical HPM systems, however, are dependent on the realization of devices which are difficult to make. Two of the major technical barriers to realizing practical devices are the lack of high-current electron emitter cathodes and the RF breakdown of component materials. The intense high frequency RF electric and magnetic fields present in HPM devices cause mechanical and electrical breakdown on surfaces and/or in volumes of the HPM device. In fact, such breakdown phenomena are believed to underlie a "pulse shortening" problem that has plagued HPM sources for decades. See R. J. Barker and E. Schamiloglu, "High-Power Microwave Sources and Technologies", chapter 10 (IEEE Press, New York, 2001).

In a number of applications, HPM device walls are required to repeatedly emit electrons from the wall surface. Repeated pulsed heating of the wall surface accompanies this repeated emission, and the repeated heating can cause surface fatigue and significant structural damage that can destroy the surfaces. The thermal shock caused by rapid temperature excursions between room temperature and the pulse heated temperature can induce defects and cracks in the wall material (typically copper) with a resultant deterioration of performance. It is therefore desirable to increase the strength of the conductor materials used for HPM wall components so that the material resists thermal shock.

Studies of strengthened copper materials for possible resistance to thermal fatigue and cracking in intense RF fields include investigation of Cu-based composites containing $Al_2O_3$ dispersoid particles. See Paper # THD20, "The Use of Dispersion-Strengthened Copper in Accelerator Designs", by R. Valdiviez, et al., International Linac Conference (LINAC 2000), Monterey, Calif., 2000. However, the use of insulating particles such as $Al_2O_3$ results in abrupt discontinuities in electrical conductivity that can produce local hot spots. Moreover, the particles can reduce thermal conductivity. Additionally, insulating particles that reach the surface of the copper will provide localized sites of enhanced electric field.

Therefore, there is a need for a high-strength and fatigue-resistant material which is also highly electrically conductive and preferably contains no electrically insulating particles.

SUMMARY OF THE INVENTION

This invention discloses novel nanocomposite material structures which are strong, highly conductive, and fatigue-resistant. It also discloses novel fabrication techniques to obtain such structures. The new nanocomposite materials comprise a high-conductivity base metal, such as copper, incorporating high-conductivity dispersoid particles that simultaneously minimize field enhancements, maintain good thermal conductivity, and enhance mechanical strength. The use of metal nanoparticles with electrical conductivity comparable to that of the base automatically removes the regions of higher RF field and enhanced current density. Additionally, conductive nanoparticles will reduce the surface's sensitivity to arc or sputtering damage. If the surface is sputtered away to uncover the nanoparticles, their properties will not be dramatically different from the base surface. Most importantly, the secondary electron emission coefficients of all materials in the nanocomposite are small and close to unity, whereas metals in the nanocomposite are small and close to unity, whereas the previously used insulating particles can produce significant and undesirable electron multiplication.

BRIEF DESCRIPTION OF THE DRAWINGS

The nature, advantages and various additional features of the invention will appear pear more fully upon consideration of the illustrative embodiments now to be described in detail with the accompanying drawings. In the drawings.

It is to be understood that the drawings are for purposes of illustrating the concepts of the invention and are not to scale.

DETAILED DESCRIPTION OF THE INVENTION

In order to achieve a nearly ideal material for high power microwave devices, applicant has provided a high conductivity composite with mechanically-strengthening nanoscale dispersoid particles that have electrical conductivity essentially matched with that of the base matrix metal. This invention can utilize any one of three types of dispersoids, the first being highly conductive metal nanoparticles artificially alloyed so that the matrix contains no or little dissolved dispersoid metal, the second being dispersoid nanoparticles made of high-conductivity, intermetallic compound, and the third being dispersoids comprising carbide, nitride, boride or carbon nanoparticles.

(a). Artificially Alloyed Metal Nanocomposites

In traditional precipitation-hardened Cu alloys employing high temperature metallurgical reactions, the electrical conductivity of the matrix metal [$\rho$(Cu)~1.67 $\mu\Omega$-cm] is significantly reduced by the solute atoms that do not completely precipitate. Any alloying element remaining in solid solution in the Cu matrix deteriorates the electrical conductivity, often by an order of magnitude or more. In order to overcome such undesirable loss of conductivity in the Cu composites, applicant forms an "artificial alloy" by incorporating high-conductivity metal nanoparticles of a second different metal into the matrix metal using a process, such as electrodeposition, that incorporates the particles without dissolving them in the base. The use of electrodeposition to form composites comprising metal and dispersoid particles has been demonstrated previously, for example, using aluminum oxide dispersoid particles. See articles by J. C. Sadak and F. K. Sautter, "Ultrasonic Agitation Alters Microstructures and Properties of Electrodeposited Cobalt and Cobalt-Al$_2$O$_3$, Metals Engineering Quarterly, August 1974, page 44, and by J. L. Stojak and J. B. Talbot, J. Electrochem. Soc. Vol. 146, 4504 (1999). However, such a use of insulator particles in copper is to be avoided for high power microwave devices for reasons described earlier.

Figure 1:
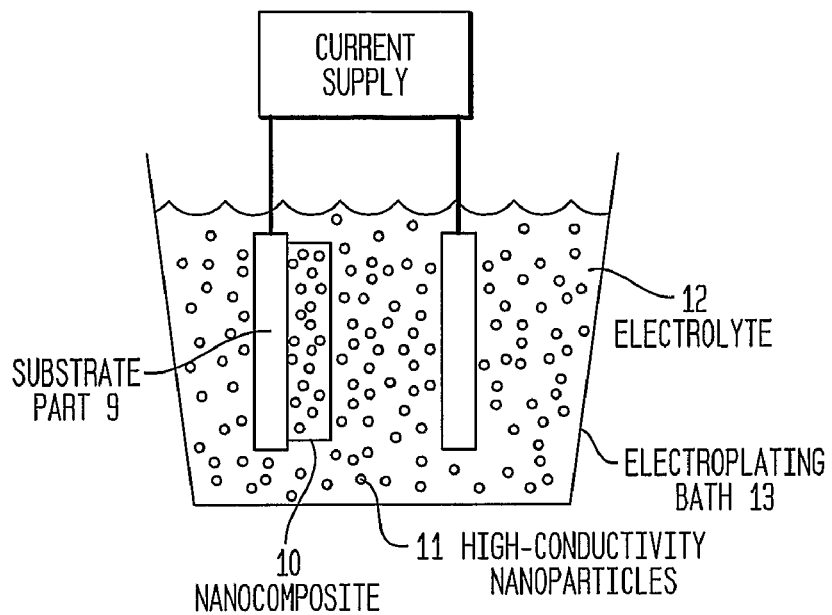
FIG. 1 describes an exemplary method of fabricating a nanocomposite containing highly electrically conductive particles via an electrolytic co-depositing process.

FIG. 1 schematically illustrates the electrodeposition on a substrate 9 of a composite 10 containing highly conductive metal nanoparticles 11 that are dispersed an electrolyte 12 in the electroplating bath 13. The composite 10 is preferably copper based. The nanoparticles are incorporated in a controlled manner into the depositing base. The most essential aspect of the invention is that the dispersoid metal is selected from very high conductivity metals such as Ag [[$\rho$~1.59 $\mu\Omega$-cm], Au [$\rho$~2.35 $\mu\Omega$-cm], Al [$\rho$~2.65 $\mu\Omega$-cm]. While these metal particles are not as strong as intermetallic compounds, the differences in lattice parameter, crystal structure, stacking fault energy, and dislocation movement behavior as compared to the host metal [such as Cu] impedes the motion of dislocations and mechanical slip or twinning deformation so that mechanical strengthening and fatigue-resistance are improved. Other metals with slightly lower conductivity such as Rh [$\rho$~4.51 $\mu\Omega$-cm], Mo [$\rho$~5.20 $\mu\Omega$-cm], W [$\rho$~5.65 $\mu\Omega$-cm] can also be considered. While less preferred because of somewhat higher electrical resistivity than Cu, these higher melting point metals still have reasonably high conductivity and have the advantage of higher mechanical strength than non-refractory metals. Further, higher melting point metals have less tendency for undesirable dissolution into the Cu matrix during, for example, stress relief annealing or baking to outgas any trapped gaseous elements incorporated during electrodeposition.

The desired elemental dispersoid particles 11 utilized in the inventive nanocomposites have electrical resistivity of less than 20 $\mu\Omega$-cm, preferably less than 6 $\mu\Omega$-cm, even more preferably less than 3 $\mu\Omega$-cm. The desired nanoparticle size is in the range of ~5-500 nm in average diameter, and preferably 10-100 nm in average diameter. (For irregularly shaped particles, the diameters can be taken as the diameter of spheres having the same volumes as the irregular particles). In the inventive high-conductivity nanocompositing process, the electroplating potential and deposition speed are carefully controlled toward a slower-rate process to minimize impurity or gas trapping. The nanoparticles 11 may optionally be pre-coated with a gold or other inert surface layer to minimize surface oxidation or contamination.

The nanocomposites so prepared may optionally be annealed to relieve stress, to drive off trapped impurities, or to reduce any inadvertently formed oxide material. The desired annealing temperature is kept low enough to avoid significant diffusion of solute atoms into the matrix metal, which would cause deterioration of electrical conductivity of a Cu matrix. Hydrogen atmosphere annealing at a relatively low temperature (<~400° C.) is often sufficient to reduce copper oxide and to remove residual oxygen from Cu. Rapid thermal annealing at higher temperature is also an option. The desired volume fraction of the dispersoids in the high-conductivity nanocomposite is in the range of ~0.2-20%, and preferably 0.5-10%, depending on the specific application.

Such high-conductivity nanocomposite materials are desirable for both high power microwave (HPM) devices operating in RF frequencies and for other applications. For example, the materials can be advantageously used for electrical connectors and electrical contacts operating in DC or AC electrical operations. They provide both high mechanical strength to maintain spring force and good electrical contact.

Figure 2A:
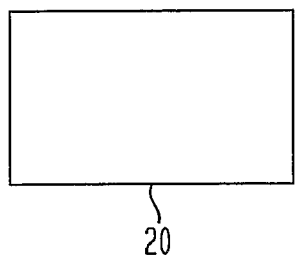
FIGS. 2(a), 2(b) and 2(c) are schematic illustrations of (a) base metal (prior art); (b) dispersion hardened high-conductivity nanocomposite material according to the invention; and (c) a functionally gradient surface structure.
Figure 2B:
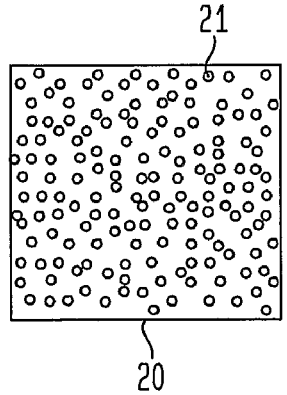
Figure 2C:
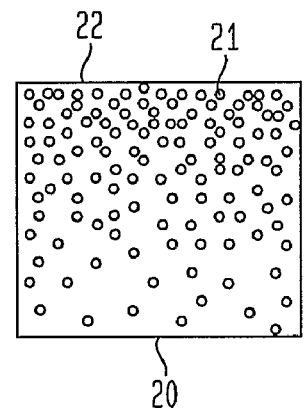

FIGS. 2(*a*), 2(*b*) and 2(*c*) schematically illustrate conductive bodies. FIG. 2(*a*) shows a conventional conductor and FIGS. 2(*b*) and 2(*c*) illustrate two forms of the inventive "artificial alloy" structure. Referring to FIG. 2(*a*) the conventional base material 20 is essentially free of the strengthening nanoparticles. FIGS. 2(*b*) and 2(*c*) show the "artificial alloy" structure according to the invention. FIG. 2(*b*) has a substantially uniform distribution of the dispersoid particles 21 throughout the volume, and FIG. 2(*c*) has a gradient distribution of dispersoid particles 21 with a high concentration near a surface 22 diminishing with increasing depth from the surface 22.

Figure 3:
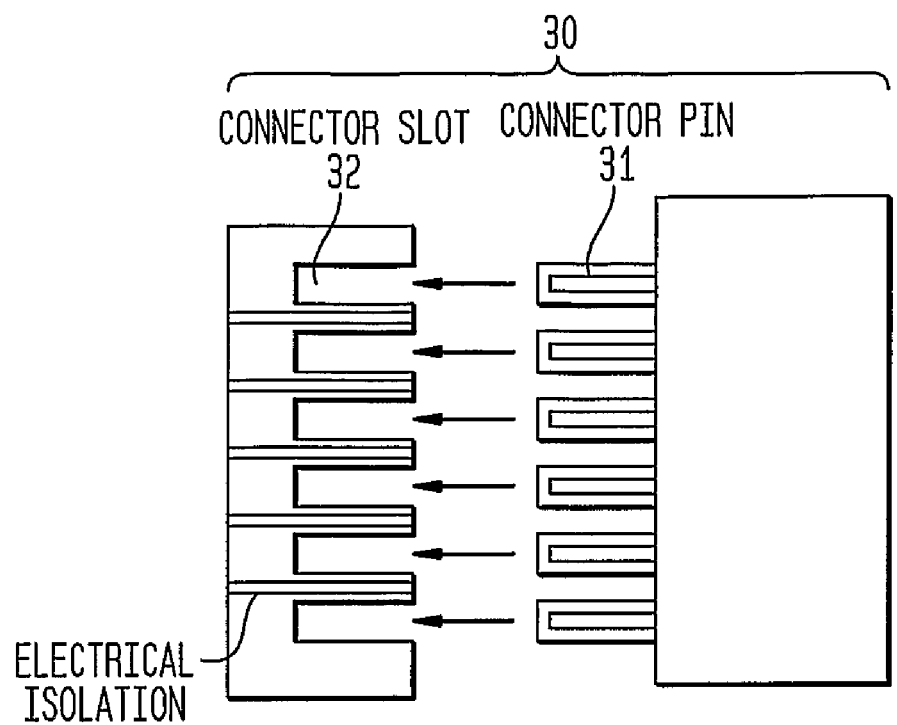
FIG. 3 illustrates an exemplary electrical connector incorporating high-conductivity, high-strength composite material according to the invention.

FIG. 3 shows an exemplary electrical connector 30 where the connector pins 31 and mating spring connector slots 32 (electrical contacts) are made of the high conductivity composite to exhibit high mechanical strength so as to maintain contact pressure for desired electrical conduction with minimal heating.

Figures 4A, 4B:
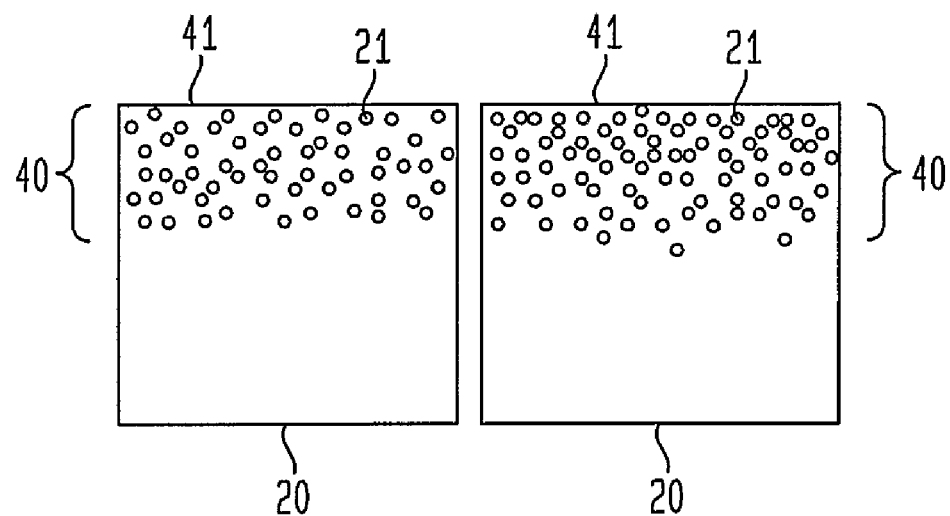
FIGS. 4(a) and (b) show surface-concentrated nanocomposite structures that provide maximal fatigue resistance of the surface regions combined with good thermal dissipation of non-composite base material beneath surface.

Alternatively, instead of the entire component being made of the dispersion-hardened composite, the dispersoid particles can be concentrated at the surface of the component. Such structures are schematically illustrated in FIGS. 4(*a*) and 4(*b*). In FIG. 4(*a*) a region 40 near a surface 41 has a relatively uniform concentration of dispersoids. The co-electrodeposition of the base 20 and the dispersoid particles 21 is carried out to form a relatively thin surface layer 40. For HPM components to be operated in a very high frequency RF environment, the thickness of the high electrical conductivity Cu nanocomposite layer can be slightly more than the RF penetration skin depth (e.g., ~1 $\mu$m thick coating would provide sufficient cushion for ~30 GHz operation for which the skin depth is ~0.4 $\mu$m).

For enhanced layer adhesion and improved resistance to thermal shock, an alternative embodiment of the invention calls for a functionally graduated nanocomposite structure in which the artificial alloy properties are gradually developed over a fraction of a micron, so as to avoid a sharp boundary, as illustrated in FIG. 4(*b*). The volume fraction of the dispersoid is altered as a function of electrodeposition time by a programmed nanocomposite electrodeposition process. The gradient structure of FIG. 4(*b*) with concentration diminishing with depth from surface 41 can provide thermal and electrical properties in the optimal condition near the surface skin depth region of the composite layer while mechanical and structural continuity is maintained in relation to the base structure. The gradient provides enhanced reliability.

(b). Nanocomposites with High-Conductivity Intermetallic Dispersoid

Most intermetallic compounds exhibit high electrical resistivity in the range of ~10-100 μΩ-cm. However, a few special intermetallics exhibit unusually low electrical resistivity, for example, $Mn_4Al_{11}$ [ρ~1.2 μΩ-cm], NiAl [ρ~1.0 μΩ-cm], and $TiAl_3$ [ρ~1.5 μΩ-cm]. See CRC Handbook of Electrical Resistivities of Binary Metallic Alloys, edited by K. Schroder, CRC Press, Boca Raton, Fla., 1983, p. 90, 92, 97. According to the invention, these mechanically strong intermetallic particles are pre-made (e.g., by atomizing, pulverizing or chemical precipitation) and incorporated into the base as by co-electrodeposition (FIG. 1) or by other processing. The resulting composite component exhibits a structure similar to those described in FIGS. 2 and 4. In the case of high-conductivity intermetallic dispersoids or carbide/nitride dispersoids (discussed below), the stability of intermetallics is such that somewhat higher post-deposition annealing temperature, if needed, could be employed with a minimal solute dissolution into the matrix.

(c). Nanocomposites Containing Conductive Carbides, Nitrides, or Borides

Some carbides, nitrides, and borides exhibit high electrical conductivity and are insoluble in highly conductive base metals such as Cu. For example, cerium nitride [ρ~4.5 μΩ-cm] is insoluble in Cu. Other carbide and nitride materials that can be used as dispersoid nanoparticles high electrical conductivity nanocomposites include TaC [ρ~40 μΩ-cm, thermal conductivity K~22 W/m·K], SiC [ρ~$10^{-2}$ Ω-cm, K~250 W/m·K], ZrC, $W_2C$, TiC, TiN, and diamond nanoparticles including those doped to exhibit improved electrical conductivity.

Diamond exhibits the highest thermal conductivity of all known materials, about 5 times higher than Cu, so heat dissipation is enhanced resulting in the reduction of the temperature excursion that causes thermal shock during RF operation. Nanoscale carbon and graphite, such as carbon nanotubes, nanographite or nanocarbon particles have dimensions as small as a few nanometers, and hence can be efficient, conductive hardening dispersoids. These nanoparticles can be incorporated into nanocomposites using the process shown in FIG. 1. The resulting composites can be made to exhibit the structures shown in FIGS. 2 and 4.

In an alternative process for fabricating the inventive high-electrical-conductivity nanocomposites, the nanoscale particles (e.g. intermetallics, carbides, nitrides, borides, or diamond) are first coated with a relatively thick base metal (e.g., at least 0.1 μm, preferably at least 1 μm of Cu), and then the coated particles are pressed together and shaped into a desired component geometry. The shaped material is then sintered at a high temperature, e.g. 400-800° C. preferably in an inert atmosphere or a reducing atmosphere such as hydrogen. The sintering temperature and time are advantageously controlled so that the diffusional mix of the elements in the particle and the base metal is minimized and thus the conductivity loss on alloying reaction is minimized. Yet another alternative processing is to mix base metal powder with the nanoparticles (e.g. intermetallics, carbides, nitrides, borides, or diamond), consolidate and shape the mixture and sinter the shaped mixture in a reducing atmosphere.

Figure 5:
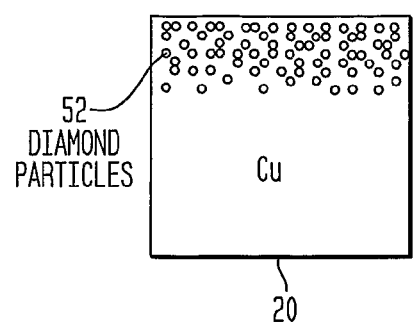
FIG. 5 illustrates high thermal conductivity nanoscale diamond particles embedded in a base surface.

In FIG. 5 high thermal conductivity nanoscale diamond particles 52 are embedded in the surface region of base 20, e.g., using the co-electrodeposition process of FIG. 1. The high thermal conductivity of diamond helps to laterally dissipate heat such as that generated by RF power in HPM device operation, thus minimizing the temperature excursion range that the component experiences.

The nanoparticles to be electroplated into the base can be optionally pre-coated with a thin layer of base or other conductive metal to facilitate the co-electrodeposition process or adhesion with the electroplated matrix. For example, high conductivity intermetallic compound particles may be pre-coated with Cu, Ag, Au or Ni, using, for example, electroless plating prior to the co-electroplating process.

While the invention has been described herein primarily as a process for fabricating a strong, high conductivity copper-based material, the process of co-electroplating or mixing to achieve very high conductivity composite can also be applied to many other base metals to obtain a high-strength, high-conductivity material. For example, the process can use base metals of Au, Ag, Ni, Co, Pd, Pt, Rh, Re, Cr, Zn, Au—Ag, or Cu—Ni.

Figure 6:
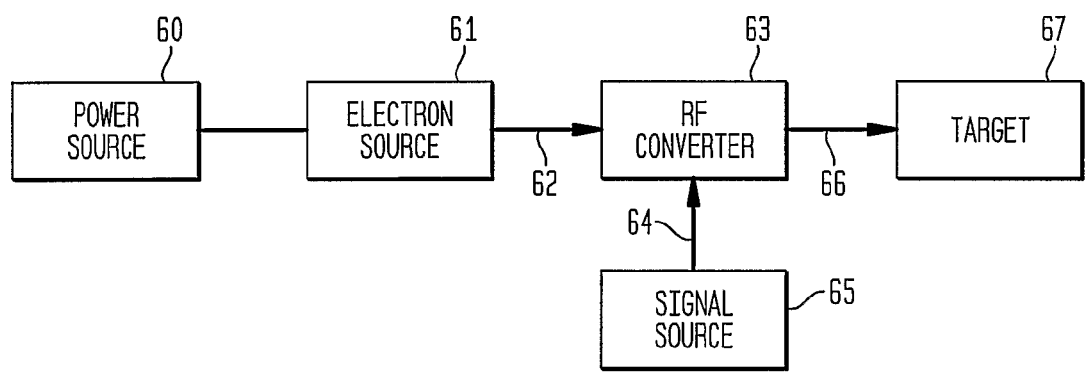
FIG. 6 is a block diagram of an exemplary high power microwave system incorporating the high-conductivity, thermal-fatigue-resistant composite material.

FIG. 6 is an exemplary HPM system employing novel materials described herein. First, pulse power from a power source 60 is supplied to the electron source 61 which can be a hot cathode or a cold cathode. The electrons emitted 62 (e.g. from the cathode of the electron gun) are then guided toward an RF converter 63 where an RF signal or microwave 64 from signal source 65 is amplified with the electron beam. The amplified RF or microwave signal 65 then travels through an RF window to an antenna or an array of antennas (not shown) that transmit the microwave beam 66 toward a target 67 (such as an enemy command center to disrupt the communication electronics and networks) or to send telecommunication signals toward a target receiver. Advantageously, or more of the gun or converter comprise the strong, high conductivity nanocomposites described herein.

It can now be seen that one aspect of the invention is an article comprising a highly conductive nanocomposite formed of a conductive base metal or alloy having high electrical conductivity and, dispersed within the base, nanoscale dispersoids of comparable high conductivity to strengthen the base without substantially reducing the conductivity of the composite as compared with the base. Typically the base material exhibits an electrical resistivity of less than 10 microhm-cm preferably less than 6 microhm-cm and more preferably less than 3 microhm-cm. The base is preferably copper but can advantageously be selected from Cu, Au, Ag, Ni, Co, Pd, Pt, Rh, Re, Cr, Zn, Au—Ag, and Cu—Ni.

The dispersoid particles can comprise conductive particles of material different from the base that is not dissolved in the base (having a solid solubility of less than 0.1 atomic %). The dispersoid particles may be elemental metal particles or alloy particles which are normally soluble in the base, but are incorporated in the base by an "artificial" structuring process (e.g. low temperature incorporation) such that the particles are not dissolved in the base.

Alternatively, the dispersoid particles can be non-elemental dispersoid particles which are insoluble in the base metal. They can be selected from high conductivity intermetallic compounds or from carbides, nitrides, borides, carbon, graphite or diamond.

The incorporation of the dispersoids can produce a composite material having mechanical strength enhanced by at least 30% over the base and high conductivity comparable to the base (less than 10 μΩ-cm, preferably less than 6 μΩ-cm and more preferably less than 3 μΩ-cm). The dispersoids can also improve the thermal fatigue resistance by at least a 30% increase in the number of thermal cycles that can be endured.

The dispersoids can be incorporated throughout a body of the material or selectively near a surface. The concentration can be substantially uniform or in the form of a gradient gradually decreasing in the direction from the surface to the interior so that mechanical adhesion, mechanical continuity and electrical continuity are not abruptly changed.

Another aspect of the invention is a method of fabricating a conductive nanocomposite material composed of a conductive matrix metal and nanoscale conductive dispersoid particles. In one embodiment, material can be made by co-depositing the matrix metal and the dispersoid particles in an electrolyte solution. In another embodiment, the material can be made by coating high conductivity nanoscale particles with the matrix metal, pressing the coated particles together, shaping the pressed coated particles into a desired geometry, and sintering the shaped product in an inert or reducing atmosphere.

Alternatively, base metal particles and dispersoid particles can be mechanically mixed, the mixture can be pressed and shaped into desired form, and the shaped product sintered in an inert or reducing atmosphere.

Particularly useful articles employing the above-described nanocomposites include high power microwave components and electrical connectors and contacts. They are also generally useful as high conductivity, high-strength, fatigue-resistant metals or alloys in devices subjected to harsh environment in which electromagnetic waves or charged particles (such as ions and electrons) can cause local heating of the metals or alloys and associated thermal fatigue or thermal shock damage. Example devices are high power microwave devices and linear accelerators which involved charged particles.

It is understood that the above-described embodiments are illustrative of only a few of the many possible specific embodiments which can represent applications of the invention. Numerous and varied other arrangements can be made by those skilled in the art without departing from the spirit and scope of the invention.

What is claimed is:

1. An article for conducting high power electrical current comprising a high conductivity nanocomposite comprised of a base of metal or alloy and a plurality of nanoscale particles dispersed within the base wherein the nanoscale particles are incorporated in a region near a surface of the base in a concentration gradient that decreases in a direction from the surface to an interior of the base, the base having an electrical resistivity less than about 10 microhm-cm and the nanoscale particles having an electrical resistivity less than about 20 microhm-cm and an average diameter of less than 500 nanometers to strengthen the base without substantially reducing the conductivity of the composite as compared with the base.

2. The article of claim 1 wherein the nanoscale particles have an average diameter less than 100 nanometers.

3. The article of claim 1 wherein the volume fraction of the nanoscale particles in the base is in the range 0.2-20% and preferably 0.5-10%.

4. The article of claim 1 wherein the base metal or alloy has an electrical resistivity less than 6 microhm-cm and preferably less than 3 microhm-cm.

5. The article of claim 1 wherein the base comprises a metal or alloy selected from the group consisting of Cu, Au, Ag, Co, Pd, Pt, Rh, Re, Cr, Zn, Au—Ag, and Cu—Ni.

6. The article of claim 1 wherein the base comprises copper.

7. The article of claim 1 wherein the nanoscale particles have an electrical resistivity less than 6 microhm-cm and preferably less than 3 microhm-cm.

8. The article of claim 1 wherein the nanoscale particles comprise metal particles with a solid solubility in the base of less than 0.1 atomic %.

9. The article of claim 1 wherein the nanoscale particles comprise particles that are insoluble in the base.

10. The article of claim 1 wherein the nanoscale particles comprise intermetallic compounds.

11. The article of claim 1 wherein the nanoscale particles comprise intermetallic compounds selected from the group consisting of $Mn_4Al_{11}$, NiAl and $TiAl_3$.

12. The article of claim 1 wherein the nanoscale particles comprise metal coated particles of material selected from the group consisting of carbides, nitrides, borides, carbon, graphite and diamond.

13. The article of claim 1 wherein the nanoscale particles comprise metal coated particles of material selected from the group consisting of cerium carbide, tantalum carbide, zirconium carbide, tin carbide, silicon carbide, titanium carbide and titanium nitride.

14. The article of claim 1 wherein the nanocomposite material has a sufficient concentration of nanoscale particles to enhance its mechanical strength enhanced by at least 30% over the base.

15. The article of claim 1 wherein the nanocomposite has a sufficient concentration of nanoscale particles to enhance its resistance to thermal fatigue by at least 30% over the base.

16. The article of claim 1 wherein the nanoscale particles are incorporated selectively near a surface of the base.

17. A high power microwave component comprising the article of claim 1.

18. An electrical connector or electrical contact comprising the article of claim 1.

19. A method of making a body of a high conductivity nanocomposite comprising the steps of:

forming a nanocomposite comprising a base metal or alloy and a plurality of nanoscale particles dispersed within the base wherein the nanoscale particles are incorporated in a region near a surface of the base in a concentration gradient that decreases in a direction from the surface to an interior of the base, the base having an electrical resistivity less than about 10 microhm-cm and the nanoscale particles having an average diameter of less than about 500 nanometers and electrical resistivity less than about 20 microhm-cm; and shaping the nanocomposite into a body.

20. The method of claim 19 wherein the nanocomposite material is formed by a co-depositing the base metal or alloy and the nanoscale particles in an electrolyte solution.

21. The method of claim 20 further comprising the step of coating the nanoscale particles with metal before forming the nanocomposite.

22. The method of claim 20 further comprising the step of annealing the nanoscale particles in an inert or reducing atmosphere before forming the nanocomposite.

23. The method of claim 20 wherein the nanocomposite material is formed by coating the nanoscale particles with the base metal or alloy, pressing the coated particles together, and sintering the pressed particles.

24. The method of claim 23 wherein the nanoscale particles are coated by electroless plating.

25. The method of claim 23 wherein the nanoscale particles are coated with at least 0.1 micrometers of the base metal or alloy and preferably at least 1 micrometer.

26. The method of claim 19 wherein the nanocomposite material is formed by mixing the dispersoid particles with particles of the base metal or alloy, pressing the mixed particles together, and sintering the pressed particles.

* * * * *